United States Patent
Imai

(10) Patent No.: US 6,552,356 B2
(45) Date of Patent: Apr. 22, 2003

(54) IMAGE RECORDING MEDIUM

(75) Inventor: Shinji Imai, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/242,365

(22) Filed: Sep. 13, 2002

(65) Prior Publication Data

US 2003/0010943 A1 Jan. 16, 2003

Related U.S. Application Data

(62) Division of application No. 09/813,884, filed on Mar. 22, 2001.

(30) Foreign Application Priority Data

Mar. 22, 2000 (JP) .................................. 2000-080484

(51) Int. Cl.$^7$ ............................................... G01T 1/16
(52) U.S. Cl. ................................... 250/580; 250/591
(58) Field of Search .............................. 250/591, 580, 250/370.08, 370.09, 28, 31

(56) References Cited

U.S. PATENT DOCUMENTS

| | | | |
|---|---|---|---|
| 4,176,275 A | 11/1979 | Korn et al. | |
| 4,535,468 A | 8/1985 | Kempter | |
| 4,961,209 A | 10/1990 | Rowlands et al. | |
| 5,268,569 A | 12/1993 | Nelson et al. | |
| 5,354,982 A | 10/1994 | Nelson et al. | |
| 5,925,890 A | 7/1999 | Van den Bogaert et al. | |
| 6,171,643 B1 * | 1/2001 | Polischuk | 427/76 |

FOREIGN PATENT DOCUMENTS

| | | |
|---|---|---|
| EP | 0 898 421 | 2/1999 |
| JP | 9-5906 | 1/1997 |
| JP | 10-232824 | 9/1998 |

OTHER PUBLICATIONS

Research Disclosure "Method and device for recording and tranducing an electromagnetic energy pattern" Jun. 1983; No. 23027; p. 229–231.
J.A. Rowlands; "X–ray imaging using amorphous selenium: Photoinduced discharge (PID) readout for digital general radiography"; Med. Phys. vol. 22; No. 12; Dec. 1995; p. 1983–1996.

* cited by examiner

Primary Examiner—Constantine Hannaher
Assistant Examiner—Timothy Moran
(74) Attorney, Agent, or Firm—Sughrue Mion, PLLC

(57) ABSTRACT

An image recording medium includes a support body which allows reading electromagnetic waves to pass through it, a first electrode layer which allows the reading electromagnetic waves to pass through it, a photoconductive reading layer which exhibits conductivity when irradiated with the reading electromagnetic waves, a charge storage portion for storing a latent-image polarity charge, a photoconductive recording layer for generating the latent-image polarity charge when irradiated with recording electromagnetic waves, and a second electrode layer which allows the recording electromagnetic waves to pass through it. The difference in thermal expansion coefficient between the support body and the photoconductive reading layer is small so that no structural destruction occurs between the support body and the photoconductive reading layer because of thermal stress generated by a temperature change in environment.

10 Claims, 10 Drawing Sheets

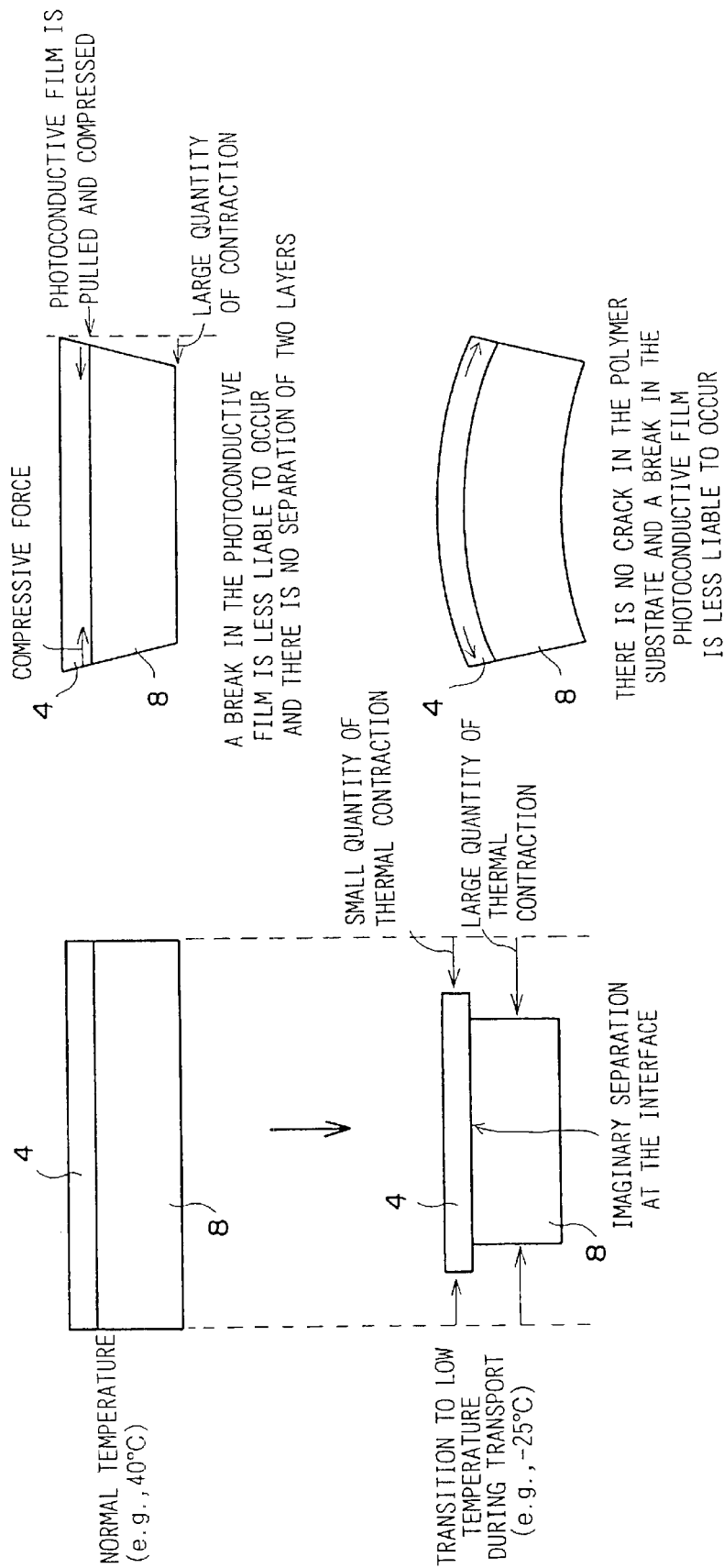

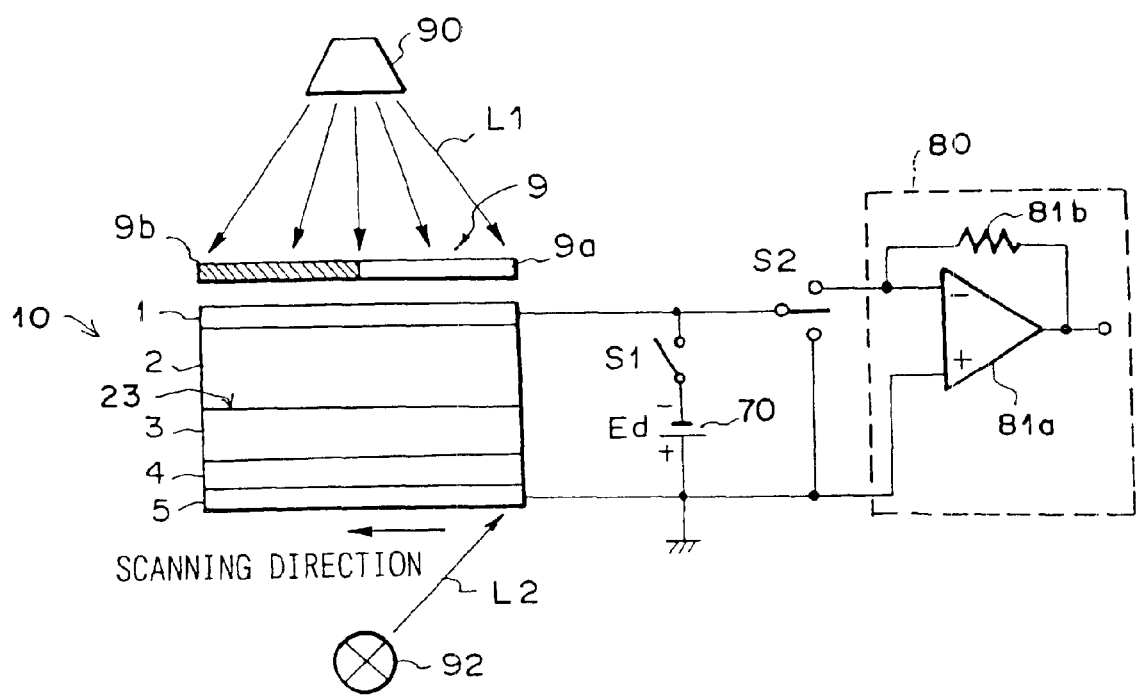
F I G. 3

F I G. 5A
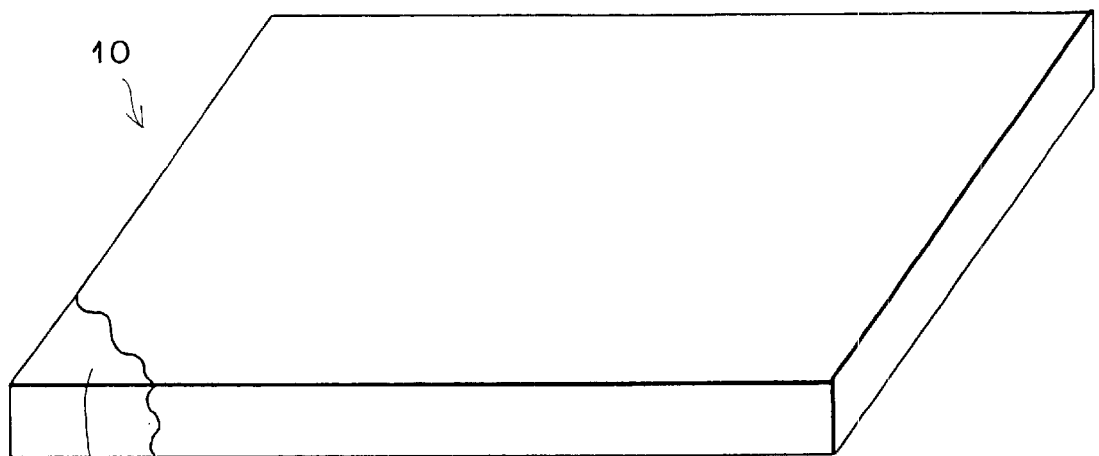
F I G. 5B
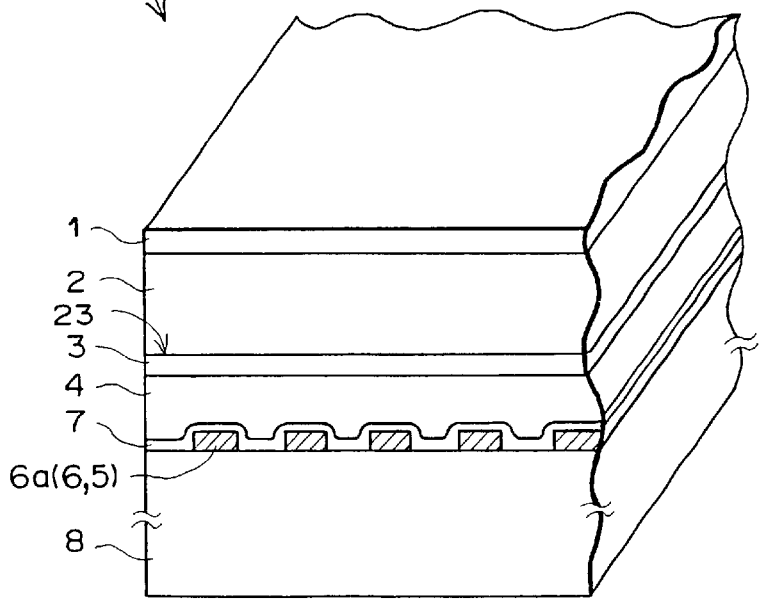

FIG. 8A
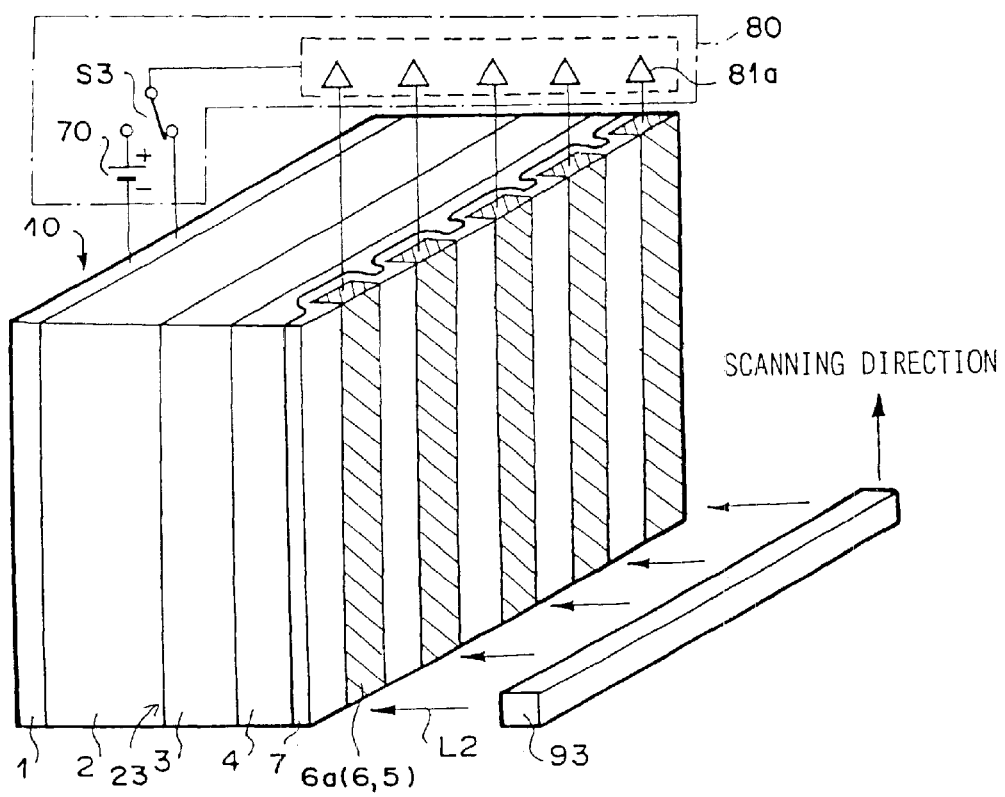
SCANNING DIRECTION
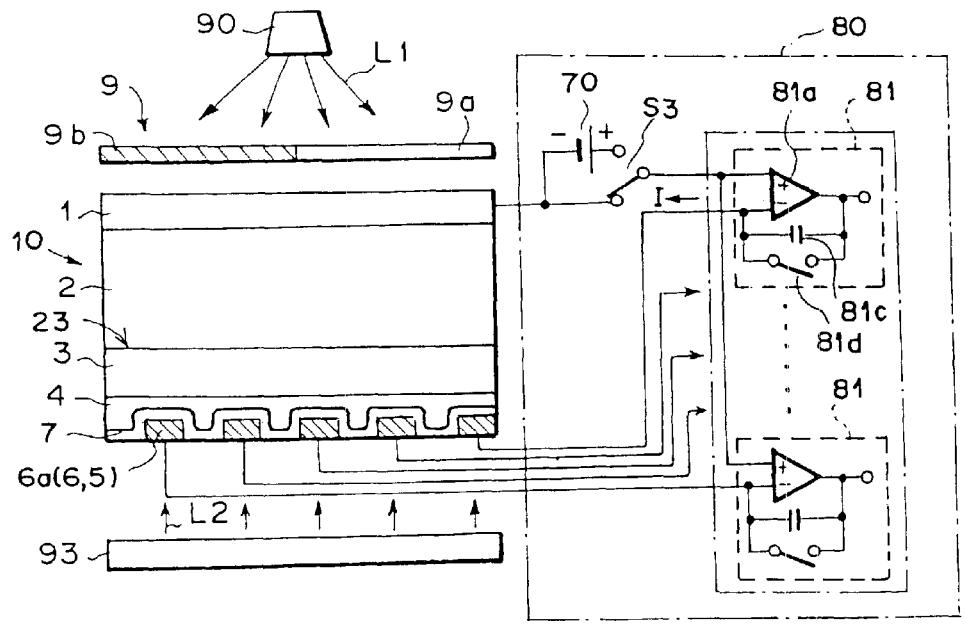
FIG. 8B

F I G. 9A
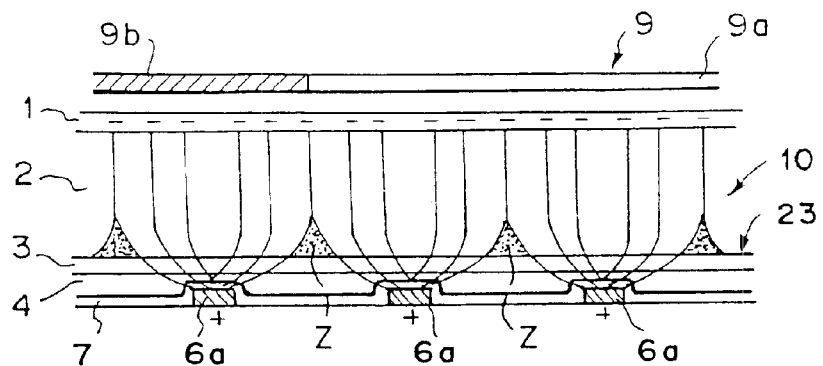
F I G. 9B
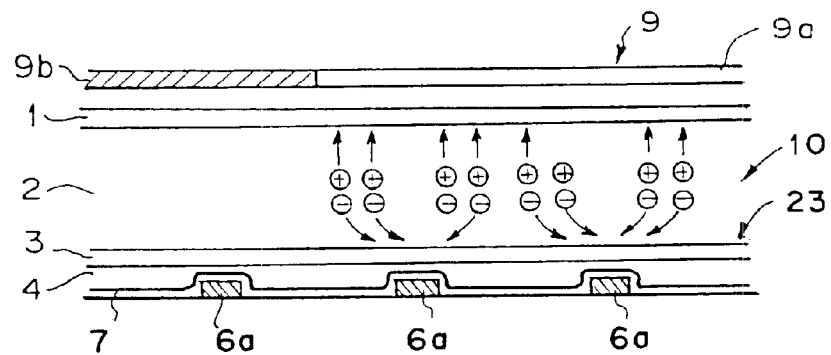
F I G. 9C
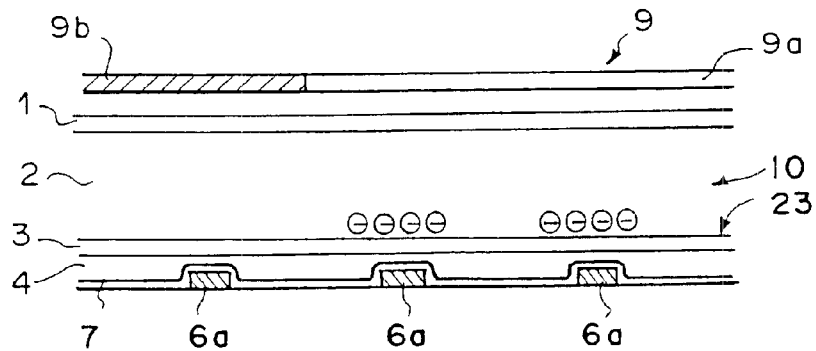

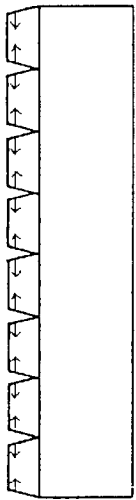
FIG. 10B (ACTUAL STATE)
TENSILE FORCE IS EXERTED AT THE PHOTOCONDUCTIVE FILM SURFACE
(BREAK IN THE PHOTOCONDUCTIVE FILM)
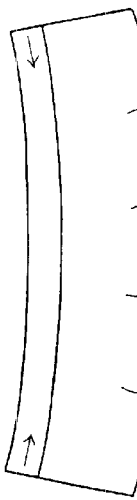
FIG. 10C
COMPRESSIVE FORCE IS EXERTED AT THE INTERFACE BETWEEN THE PHOTOCONDUCTIVE FILM AND THE GLASS SUBSTRATE
(SEPARATION OF TWO LAYERS)
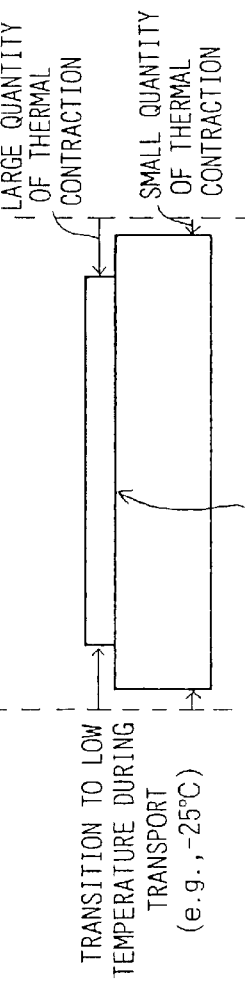
FIG. 10D
(CRACKS IN THE GLASS SUBSTRATE)
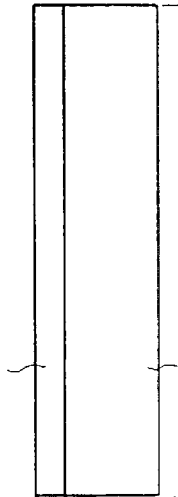
FIG. 10A

IMAGE RECORDING MEDIUM

This is a divisional of application Ser. No. 09/813,884 filed Mar. 22, 2001; the disclosure of which is incorporated derein by reference.

BACKGROUND OF THE INVENTION

1. Field of the Invention

The present invention relates to an image recording medium that is capable of recording image information as an electrostatic latent image.

2. Description of the Related Art

For example, in medical X-ray photographing, for the purposes of a reduction in the radiation dose to which a subject is exposed, an enhancement in diagnosis performance, etc., there has been disclosed a system that uses an image recording medium employing a photoconductor sensitive to X-rays (e.g., a selenium (Se) plate, etc.,). In the system, an electrostatic latent image is recorded on the image recording medium by the use of X-rays and then the electrostatic latent image is read out (e.g., U.S. Pat. Nos. 4,176,275, 5,268,569, 5,354,982, 4,535,468, "23027 Method and Device for Recording and Transducing an Electromagnetic Energy Pattern," in Research Disclosure, June 1983, Japanese Unexamined Patent Publication No. 9(1997)-5906, U.S. Pat. No. 4,961,209, "X-ray Imaging Using Amorphous Selenium," in Med. Phys. 22 (12), etc.).

The above-mentioned U.S. Pat. No. 4,535,468 discloses an image recording medium, in which (1) a 100~500-μm-thick photoconductive recording layer with amorphous selenium (α-Se) as its main component, (2) a 0.01~10.0-μm-thick intervening layer (trap layer), which consists of $AsS_4$, $As_2S_3$, $As_2Se_3$, etc., for storing, as a trap, a latent-image polarity charge generated within the photoconductive recording layer, (3) a 0.5~100-μm-thick photoconductive reading layer with amorphous selenium (α-Se) as its main component, and (4) a 100-nm-thick reading-light transmitting electrode layer, consisting of Au or indium tin oxide (ITO), which allows reading electromagnetic waves (hereinafter also referred to as reading light) to pass through it, are stacked in the recited order on a 2-mm-thick recording-light transmitting electrode layer (conductive substrate), consisting of Al, which allows recording electromagnetic waves (hereinafter also referred to as recording light) to pass through it. Particularly, it is disclosed that the use of the reading-light transmitting electrode layer as a positive electrode is preferred because the satisfactory hole mobility of α-Se can be utilized and that a blocking layer, consisting of an organic substance, is interposed between the reading-light transmitting electrode layer and the photoconductive reading layer in order to prevent S/N-ratio degradation due to the direct injection of electric charge through the electrode of the reading-light transmitting electrode layer. That is, this image recording medium is a multi-layer recording medium having both high dark resistance and excellent read response speed, and the image recording medium is constructed mainly of a layer having α-Se as its main component.

For enhancing the S/N ratio of an image, and also for performing parallel reading (mainly in a horizontal scanning direction) to shorten the reading time, there are cases where the electrode of the reading-light transmitting electrode layer is replaced with a stripe electrode constructed of a large number of electrode elements (line electrode elements) disposed at intervals of a pixel pitch (e.g., Japanese Patent Application No. 10(1998)-232824 filed by the present applicant). However, in the stacked construction of the image recording medium described in above-mentioned U.S. Pat. No. 4,535,468, in the final fabrication step the reading-light transmitting electrode layer must be formed after formation of the photoconductive reading layer, so it is difficult to form the aforementioned stripe electrode. The reason for this is that photoetching is used for forming the electrode elements of the stripe electrode, but since a baking step is usually performed on photoresist at high temperature (e.g., 200° C.), α-Se forming a previously formed photoconductive layer cannot endure such a high temperature and therefore the characteristics will be degraded. Furthermore, since an alkaline developing solution, which is employed in the step of developing the photoresist, contacts α-Se and gives off harmful gases, steps becomes complicated for removing the harmful gases, resulting in an increased cost.

On the other hand, the present applicant has proposed, in the aforementioned Japanese Patent Application No. 10(1998)-232824, an image recording medium (electrostatic recording body) in which (1) a recording-light transmitting electrode layer which allows recording light to pass through it, (2) a 50~1000-μm-thick photoconductive recording layer with amorphous selenium (α-Se) as its main component, (3) a charge transfer layer for forming a charge storage portion, which consists of α-Se doped 10 to 200 ppm with an organic substance or Cl and stores a latent-image polarity charge generated in the photoconductive recording layer, at the interface between the charge transfer layer and the photoconductive recording layer, (4) a photoconductive reading layer with α-Se as its main component, and (5) a reading-light transmitting electrode layer which allows reading light to pass through it, are disposed in the recited order. The aforementioned Japanese Patent Application No. 10(1998)-232824 does not disclose whether the image recording medium is fabricated in sequence from the recording-light transmitting electrode layer or conversely from the reading-light transmitting electrode layer. The image recording medium can be formed in either order. However, the aforementioned Japanese Patent Application No. 10(1998)-232824 has proposed that a conductive substance such as a film of NESA ($SnO_2$) is provided as the reading-light transmitting electrode layer on a support body (transparent glass substrate) and has also proposed that the reading-light transmitting electrode layer is used as a positive electrode and that comb teeth are formed by the semiconductor fabrication technology in sufficiently narrow intervals of a fine pitch between comb teeth corresponding to a pixel pitch. That is, it has been proposed that the electrode of the reading-light transmitting electrode layer is constructed of a stripe electrode consisting of electrode elements disposed in the intervals of a pixel pitch. In this case, the stripe electrode is first formed on the transparent glass substrate by photoetching, etc. Then, the photoconductive reading layer, the photoconductive recording layer, the charge transfer layer, the photoconductive reading layer, and the recording-light transmitting electrode layer are formed in sequence. Although a specific numeral value for the pixel pitch has not been indicated, it would be obvious to those skilled in this field that the pixel pitch is 50 to 200 μm, because in the medical X-ray photographing, the image recording medium maintains high sharpness and makes a high S/N ratio possible.

In addition, the aforementioned Japanese Patent Application No. 10(1998)-232824, as with the aforementioned U.S. Pat. No. 4,535,468, has proposed that the S/N-ratio degradation due to the direct injection of the positive charge in the reading-light transmitting electrode layer can be prevented by providing a blocking layer of about 500 Å, which consists of an organic substance such as $CeO_2$, between the reading-light transmitting electrode layer and the photoconductive reading layer.

On the other hand, the inventors of this application have made various investigations with respect to the image recording medium proposed in the aforementioned Japanese Patent Application No. 10(1998)-232824 and found the following facts:

(1) The method, which forms an ITO film of thickness 50 to 200 nm (i.e., the reading-light transmitting electrode layer) on the transparent glass substrate and then forms the stripe electrode by photoetching, is preferred because it can form a fine stripe pattern inexpensively;

(2) The photoconductive recording layer has high dark resistance, if it is constructed of an α-Se layer having a thickness of 50 to 1000 μm;

(3) The charge transfer layer is excellent in after image and read response speed, if it is a stacked hole transfer layer consisting of two stacked layers: a first hole transfer layer of thickness 0.1 to 1 μm, consisting of a thin organic substance, which has electrons to form a charge storage portions, and a second hole transfer layer of thickness 5 to 30 μm consisting of α-Se doped 10 to 200 ppm with Cl, which transfers a hole at high speed and has a small number of hole traps;

(4) The photoconductive reading layer has high dark resistance, if it is constructed of an α-Se layer having a thickness of 0.05 to 0.5 μm; and (5) If the charge transfer layer is a stacked hole transfer layer constructed of a first hole transfer layer of thickness 0.1 to 1 μm consisting of PVK or TPD and a second hole transfer layer of thickness 5 to 30 μm having α-Se doped 10 to 200 ppm with Cl as its main component, then the first charge transfer layer functions a strong insulator with respect to a latent-image polarity charge and the second charge transfer layer transfers a transfer polarity charge at high speed. This makes the charge transfer layer an ideal charge transfer layer which is excellent in afterimage and read response speed. However, even in the case where the second hole transfer layer of the charge transfer layer is replaced with α-Se of thickness 5 to 30 μm so that the charge transfer layer also functions as the photoconductive reading layer, relatively satisfactory effects are obtained and fabrication becomes easy.

From the foregoing facts it is found that the image recording medium described in the aforementioned Japanese Patent Application No. 10(1998)-232824 is a multi-layer recording medium which has high dark resistance and excellent read response time. It is desirable that the image recording medium be constructed mainly of a layer having α-Se as its main component. The glass substrate employs, for example, Corning-1737 (thickness 1.1 mm) made by Corning, and the effective size of the medium is, for example, 20×20 cm or more. When it is used in chest photographing, the effective size is 43×43 cm.

The above-mentioned image recording medium, incidentally, is subjected to a great temperature fluctuation cycle during shipping transport under a severe environment, for example, a cold climate condition. If the image recording medium with the selenium (Se) multi-layer film on the glass substrate, among the image recording media disclosed in the aforementioned Japanese Patent Application No. 10(1998)-232824, is subjected to such a great temperature fluctuation cycle, thermal stress will occur at the interface between the glass substrate and the selenium (Se) film (i.e., the photoconductive layer) because of a difference in thermal expansion coefficient therebetween (approximately 10 times). As a result, the problem of destruction due to a difference in thermal expansion will arise. For instance, the selenium (Se) film and the glass substrate are separated from each other, or the selenium (Se) film breaks, or the glass substrate cracks. The larger the image recording medium, the more conspicuous the problem of destruction.

As described above, the image recording medium is subjected to a great temperature fluctuation cycle during ship transport under a severe environment, for example, a cold climate condition. In that case, the image recording medium changes largely to low temperature and then returns to the normal temperature. If the image recording medium with the selenium (Se) multi-layer film on the glass substrate, among the image recording media disclosed in the aforementioned Japanese Patent Application No. 10(1998)-232824, is subjected to such a great temperature cycle, particularly a temperature cycle on the low temperature side, then the problem of destruction due to a difference in thermal expansion will arise, because the thermal expansion coefficient of the glass substrate is about ten times smaller than that of the selenium (Se) film. For example, as shown in FIG. 10A, the thermal contraction amount of the glass substrate becomes much smaller than that of the selenium (Se) film, so that the surface of the selenium (Se) film cannot endure tensile stress and breaks. In addition, the selenium (Se) film and the glass substrate are separated from each other (FIG. 10C) Furthermore, since the glass substrate is a brittle material which does not deform flexibly (tends to crack), the glass substrate cracks (FIG. 10D). The larger the image recording medium, the more conspicuous the problem of destruction.

SUMMARY OF THE INVENTION

The present invention has been made in view of the above-mentioned circumstances. Accordingly, it is an object of the present invention to provide an image recording medium that is capable of eliminating the problem of destruction due to a difference in thermal expansion even when the selenium (Se) film is formed on the support body. Another object of the invention is to provide an image recording medium which is capable of eliminating the problem of destruction resulting from a fall in temperature, even when the selenium (Se) film is formed on the support body.

In accordance with an important aspect of the present invention, there is provided a first image recording medium comprising: a support body which allows reading electromagnetic waves to pass through it; a first electrode layer, formed on the support body, which allows the reading electromagnetic waves to pass through it; a photoconductive reading layer, formed on the first electrode layer, which exhibits conductivity when irradiated with the reading electromagnetic waves; a charge storage portion, formed on the photoconductive reading layer, for storing a latent-image polarity charge; a photoconductive recording layer, formed on the charge storage portion, for generating the latent-image polarity charge when irradiated with recording electromagnetic waves; and a second electrode layer, formed on the photoconductive recording layer, which allows the recording electromagnetic waves to pass through it; wherein a difference in thermal expansion coefficient between the support body and the photoconductive reading layer is small so that no structural destruction occurs between the support body and the photoconductive reading layer because of thermal stress generated by a temperature change.

The expression "no structural destruction occurs between the support body and the photoconductive reading layer" not only means that no structural destruction occurs between the two layers, but also means that neither the support body nor the photoconductive reading layer is structurally destructed.

In the first image recording medium of the present invention, it is desirable that the support body be deformable with a temperature change. Particularly, it is desirable that the support body be deformable when the temperature of the surrounding environment falls.

The critical point at which structural destruction occurs because of thermal stress depends on the materials of the support body and the photoconductive reading layer. It is desirable that the thermal expansion coefficient of the support body be within a few tenths to a few times the thermal expansion coefficient of the photoconductive reading layer in order to prevent structural destruction. It is more desirable that the thermal expansion coefficients of the support body and the photoconductive reading layer be approximately equal and that a difference in thermal expansion between the two be within $2.5 \times 10^{-5}/K@40°$ C. where "^" indicates an exponent. It is most desirable that the thermal expansion coefficients of the two be nearly the same.

More specifically, in the case where the photoconductive reading layer has amorphous selenium ($\alpha$-Se) as its main component, the thermal expansion coefficient of the selenium (Se) material is $3.68 \times 10^{-5}/K@40°$ C. Therefore, it is preferable that the thermal expansion coefficient of the support body be 1.2 to $6.2 \times 10^{-5}/K@40°$ C. and further preferable that it be is 2.2 to $5.2 \times 10^{-5}/K@40°$ C.

The material of the support body, having a thermal expansion coefficient within the aforementioned range, and deformable with a temperature change, can employ an organic polymer material, such as polycarbonate, polymethylmethacylate (PMMA), etc.

In accordance with another important aspect of the present invention, there is provided a second image recording medium comprising: a support body which allows reading electromagnetic waves to pass through it; a first electrode layer, formed on the support body, which allows the reading electromagnetic waves to pass through it; a photoconductive reading layer, formed on the first electrode layer, which exhibits conductivity when irradiated with the reading electromagnetic waves; a charge storage portion, formed on the photoconductive reading layer, for storing a latent-image polarity charge; a photoconductive recording layer, formed on the charge storage portion, for generating the latent-image polarity charge when irradiated with recording electromagnetic waves; and a second electrode layer, formed on the photoconductive recording layer, which allows the recording electromagnetic waves to pass through it; wherein between the photoconductive reading layer and the first electrode layer, there is provided a buffer layer, which allows the reading electromagnetic waves to pass through it, for alleviating thermal stress between the photoconductive reading layer and the first electrode layer.

Preferably, the buffer layer, in addition to being a layer which alleviates thermal stress, has both the performance of blocking the electric charge that is injected via the electrode of the first electrode layer and the function of suppressing interfacial crystallization between the first electrode layer and the photoconductive reading layer. Furthermore, it is preferable that the buffer layer be a layer which reinforces the connection between the first electrode layer and the photoconductive reading layer.

The expression "alleviates thermal stress" is intended to mean that a thermal expansion mismatch is alleviated so that the aforementioned structural destruction will not occur because of a difference in thermal expansion coefficient between the photoconductive reading layer and the support body. More specifically, it is necessary that the buffer layer allow transmission of light and have the blocking performance and further necessary that it be elastic. For this reason, it is desirable that the buffer layer be constructed of an organic thin film, which is transparent and elastic and has satisfactory blocking performance, such as organic polymer insulation materials (e.g., polyamide, polyimide, polyester, polyvinylbutyral, polyvinylpyrolidone, polyurethane, polymethylmethacrylate, polycarbonate, etc.), a mixed film, consisting of an organic binder and a low molecular organic material, etc.

It is preferable that the thickness of the buffer film be about 0.05 to 5 $\mu$m. However, a range of 0.1 to 5 $\mu$m is preferred in order to buffer thermal stress. On the other hand, a range of 0.05 to 0.5 $\mu$m is preferred in order to obtain satisfactory blocking performance having no afterimage. From a trade-off between the two, it is desirable that the film thickness be in a range of 0.1 to 0.5 $\mu$m.

According the first image recording medium of the present invention, the difference in thermal expansion coefficient between the support body and the photoconductive reading layer is small so that no structural destruction occurs between the support body and the photoconductive reading layer because of thermal stress generated by a temperature change in environment. Thus, the first image recording medium of the present invention is capable of eliminating the problem of structural destruction which is caused by thermal stress resulting from the difference in thermal expansion coefficient between the support body and the photoconductive reading layer.

For example, in the case where the temperature of environment falls, there is no possibility that the thermal contraction amount of the photoconductive reading layer (e.g., the selenium (Se) film) will become greater than that of the support body, if the thermal expansion coefficient of the support body is approximately equal to the thermal expansion coefficient of the photoconductive reading layer, or within several times. Since tensile force is not exerted on the surface of the photoconductive film as is done in the prior art, the photoconductive film is less likely to break. On the other hand, if the thermal expansion coefficient of the support body is greater than that of the photoconductive reading layer, compressive stress will be exerted on the photoconductive film. However, if a difference in thermal expansion coefficient between the support body and the photoconductive film is within several times, destruction such as breakage or separation of the photoconductive film will not occur, because the photoconductive film has high resistance to compressive stress, like ordinary brittle materials.

Even in the case where the thermal expansion coefficient of the support body is great and therefore a difference in thermal contraction amount occurs between the support body and the photoconductive film, if the support body is deformable with a temperature change in environment, the image recording medium absorbs the different in thermal contraction amount by flexibly deforming so that the center of curvature is moved to the side of the support body, for example, when the temperature of environment falls. Thus, the support body is less liable to crack.

Moreover, since compressive stress is exerted on the entire surface of the photoconductive film (selenium film), the magnitude of tensile stress in the circumferential portion of the photoconductive film is alleviated even when the photoconductive film is deformed so that the center of curvature is moved to the side of the support body. Thus, the photoconductive film is also less liable to break even when the aforementioned deformation occurs. When the thermal expansion coefficients of the support body and the photoconductive reading layer are nearly the same, a problem which is caused by the influence of thermal stress resulting from the difference in thermal expansion coefficient between the support body and the photoconductive reading layer will not arise. If the support body employs an organic polymer material, the support body has the advantage that it has a strong resistance to shock, compared with a glass substrate.

Furthermore, the second image recording medium of the present invention is constructed so that, between the photoconductive reading layer and the first electrode layer, there is provided a buffer layer, which allows the reading electromagnetic waves to pass through it, for alleviating thermal stress between the photoconductive reading layer and the first electrode layer. Thus, the second image recording medium is capable of alleviating a thermal expansion mismatch between the two layers. Even in the case where the difference in thermal expansion coefficient between the two layers is great (e.g., about 10 times), the aforementioned structural destruction can be prevented. This makes it possible to freely select the material of the support body independently of the thermal expansion coefficient of the photoconductive reading layer.

BRIEF DESCRIPTION OF THE DRAWINGS

The present invention will be described in further detail with reference to the accompanying drawings wherein:

FIGS. 2A through 2C are diagrams used to explain the structural resistance of the electrostatic recording body with respect to a change in temperature;

FIG. 3 is a schematic diagram integrally showing an electrostatic latent image recorder and an electrostatic latent image reader which each employ the electrostatic recording body of the first embodiment;

FIG. 5A is a perspective view showing an electrostatic recording body constructed according to a third embodiment of the present invention;

FIG. 5B is an enlarged part-sectional view of the electrostatic recording body shown in FIG. 5A;

FIG. 8A is a perspective view integrally showing an electrostatic latent image recorder and an electrostatic latent image reader which each employ the electrostatic recording body of the third embodiment;

FIG. 8B is a schematic diagram showing a recording-reading system that employs the electrostatic recording body of the third embodiment;

FIGS. 9A through 9C are diagrams used for explaining the process of recording an electrostatic latent image on the electrostatic recording body of the third embodiment; and FIGS. 10A through 10D are diagrams used to explain how structural destruction occurs in the case of employing a glass substrate.

DESCRIPTION OF THE PREFERRED EMBODIMENTS

Figure 1A:
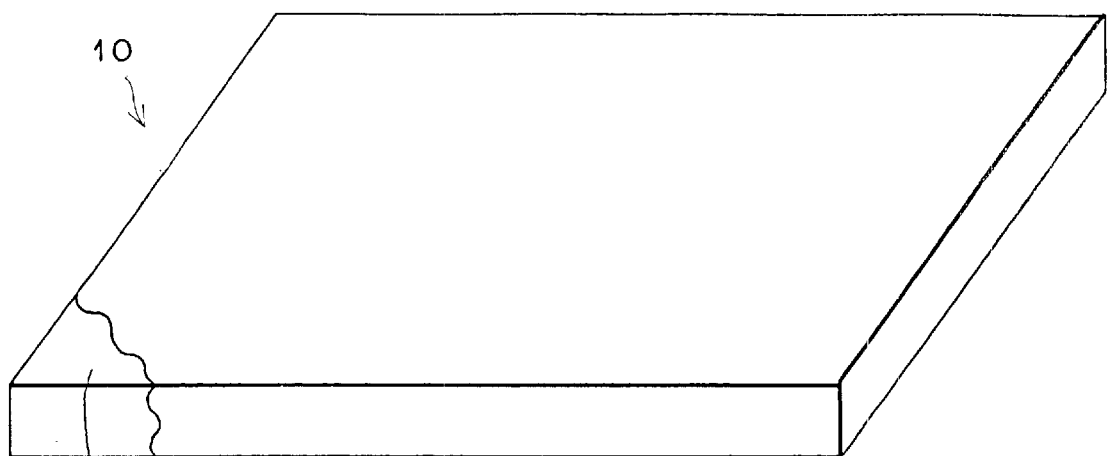
FIG. 1A is a perspective view showing an electrostatic recording body constructed according to a first embodiment of the present invention.
Figure 1B:
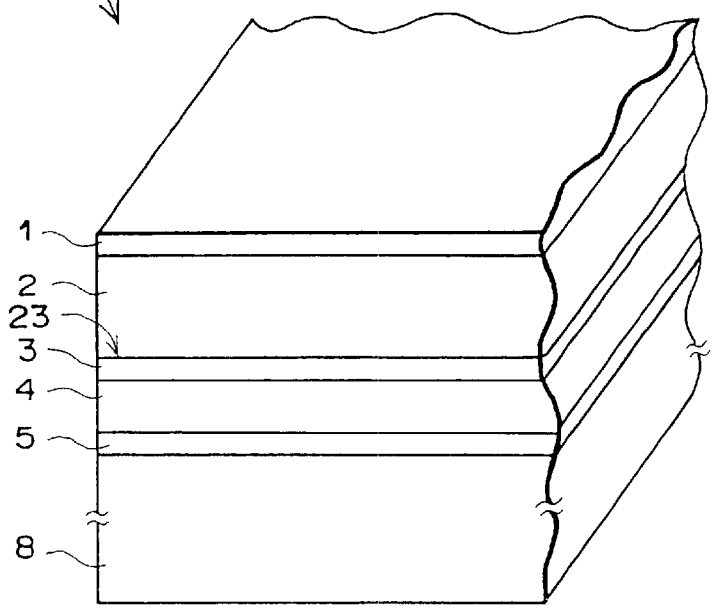
FIG. 1B is an enlarged part-sectional view of the electrostatic recording body shown in FIG. 1A.

Referring now in greater detail to the drawings and initially to FIGS. 1 and 2, there is shown an electrostatic recording body 10 in accordance with a first embodiment of the present invention. The electrostatic recording body 10 includes (1) a recording-light transmitting electrode layer 1 which allows recording light (e.g., radiation such as X-rays) to pass through it, (2) a photoconductive recording layer 2 which exhibits conductivity when irradiated with the recording light transmitted through the recording-light transmitting electrode layer 1, (3) a charge transfer layer 3 which operates as practically an insulator with respect to the electric charge generated in the recording-light transmitting electrode layer 1 (hereinafter referred to as a latent-image polarity charge) and also operates as practically a conductor with respect to an electric charge having a polarity opposite to the latent-image polarity charge (hereinafter referred to as a transfer polarity charge), (4) a photoconductive reading layer 4 which exhibits conductivity when irradiated with reading light (e.g., blue light with a wavelength of 500 nm or less), (5) a reading-light transmitting electrode layer 5 which allows the recording light to pass through it, and (6) a support body 8 which allows the reading light to pass through it. These layers are stacked on the support body 8 in the recited order. In the interface between the photoconductive recording layer 2 and the charge transfer layer 3, a charge storage portion 23 is formed for storing the latent-image polarity charge generated within the photoconductive recording layer 2. Assume that in each of the following embodiments, the recording-light transmitting electrode layer 1 has a negative charge and the reading-light transmitting electrode layer 5 has a positive charge. Also, assume that the charge storage portion 23, formed in the interface between the photoconductive recording layer 2 and the charge transfer layer 3, stores the latent-image polarity charge (negative charge) and that the charge transfer layer 3 functions as a hole transfer layer where the mobility of the transfer polarity charge (positive charge) is greater that that of the latent-image polarity charge (negative charge).

In fabricating the electrostatic recording body 10, the reading-light transmitting electrode layer 5 is first stacked on the support body 8. Then, the photoconductive reading layer 4, the charge transfer layer 3, the photoconductive recording layer 2, and the recording-light transmitting electrode layer 1 are stacked sequentially on the reading-light transmitting electrode layer 5.

The size (area) of the electrostatic recording body 10 is, for example, 20×20 cm or more. Particularly, in the case of chest X-ray photographing, the effective size is about 43×43 cm.

The support body 8 uses a substance that is transparent to the recording light and deformable with a temperature change, the thermal expansion coefficient of the substance being within a few tenths to a few times the thermal expansion coefficient of the substance of the photoconductive reading layer 4. Preferably, the support body 8 uses a substance whose thermal expansion coefficient is relatively near to that of the photoconductive reading layer 4. As described later, in the present invention, amorphous selenium (α-Se) is used as the photoconductive reading layer 4. Therefore, considering that the thermal expansion coefficient of Se is $3.68 \times 10^{-5}/K@40°$ C. (where "^" indicates an exponent), the support body 8 uses a substance whose thermal expansion coefficient is 1.0 to $10.0 \times 10^{-5}/K@40°$ C., preferably 1.2 to $6.2 \times 10^{-5}/K@40°$ C., and further preferably 2.2 to $5.2 \times 10^{-5}/K@40°$ C. As a deformable substance whose thermal expansion coefficient is in this range, an organic polymer material can be used. Note that glass is not suitable as the first embodiment, because the thermal expansion coefficient is $0.378 \times 10^{-5}/K@40°$ C., for example, in the case of Corning-1737 of thickness 1.1 mm.

Specific examples for the organic polymer material are polycarbonate with a thermal expansion coefficient of $7.0 \times 10^{-5}/K@40°$ C., polymethylmethacylate (PMMA) with a thermal expansion coefficient of $5.0 \times 10^{-5}/K@40°$ C., etc.

With the aforementioned substances, the thermal expansion of the support body 8 as a substrate is matched with that of the photoconductive reading layer 4 (selenium film). Therefore, even if the support body 8 and the photoconductive reading layer 4 are subjected to a great temperature cycle during ship transport under a severe environment, for example, a cold climate condition, thermal stress will not occur at the interface between the support body 8 and the photoconductive reading layer 4 and therefore the two will not be separated physically from each other, or the photoconductive reading layer 4 (selenium film) will not break, or the support body 8 will not crack. Thus, there is no possibility that the problem of destruction due to a difference in thermal expansion will arise. Furthermore, the organic polymer material has the advantage that it has a strong resistance to shock, compared with a glass substrate.

For example, if the thermal expansion coefficient of the support body 8 is approximately equal to that of the photoconductive reading layer 4 or within several times, there is no possibility that the thermal contraction amount of the photoconductive reading layer 4 will become greater than that of the support body 8 when the temperature of environment falls, as shown in FIG. 2A. As a result, since the contact surface or upper layer of the photoconductive reading layer 4 is no longer subjected to tensile stress as is done in the prior art, the photoconductive reading layer 4 and the support body 8 become less liable to break.

If the thermal expansion coefficient of the support body 8 is greater than that of the photoconductive reading layer 4, compressive stress will be exerted on the photoconductive reading layer 4, as shown in FIG. 2B. However, if a difference in thermal expansion coefficient between the support body 8 and the photoconductive reading layer 4 is within several times, destruction such as breakage or separation of the photoconductive layer 4 will not occur, because the photoconductive reading layer 4 (selenium film) has high resistance to compressive stress, like ordinary brittle materials.

Even in the case where the thermal expansion coefficient of the support body 8 is great and therefore a different in thermal contraction amount occurs between the support body 8 and the photoconductive reading layer 4, if the support body 8 is deformable with a temperature change, the electrostatic recording body 10 absorbs the different in thermal contraction amount by flexibly deforming so that the center of curvature is moved to the side of the support body 8, for example, when the temperature of environment falls. Thus, the support body 8 is less liable to crack.

Furthermore, since a photoconductive film such as a selenium film is subjected as a whole to compressive stress, the magnitude of tensile stress in the circumferential portion of the photoconductive film is alleviated even when the photoconductive film is deformed so that the center of curvature is moved to the side of the support body 8. Thus, the photoconductive film is less liable to break even when the aforementioned deformation occurs.

A material for the recording-light transmitting electrode layer 1 will be satisfied if it allows recording light to pass through it, and a material for the reading-light transmitting electrode layer 5 will be satisfied if it allows reading light to pass through it. The recording-light transmitting electrode layer 1 and the reading-light transmitting electrode layer 5 can employ, for example, a NESA ($SnO_2$) film, an indium tin oxide (ITO) film, or an amorphous light-transmitting oxide film (e.g., an IDEMITSU X-metal oxide film manufactured by IDEMITSU), which each have a thickness of 50 to 200 nm. In the case where an image is recorded by irradiating X-rays through the recording-light transmitting electrode layer 1, it is unnecessary to transmit visible light, so the recording-light transmitting electrode layer 1 can also employ, for example, Al or Au, which has a thickness of 100 nm.

Each of the electrode layers 1 and 5 may be a flat electrode (where the entire electrode is constructed of a single electrode), as in the first embodiment. Alternatively, it may be a stripe electrode consisting of line electrode elements arrayed in a direction perpendicular to the longitudinal direction of the line electrode element. In the case where an insulator is interposed between the line electrode elements of the stripe electrode, the electrode layer is constructed by the line electrode elements and the insulators. On the other hand, in the case where the next layer is stacked directly on the line electrode elements without interposing an insulator therebetween, as in a third embodiment of the present invention to be described later, the electrode layer is constructed only by the stripe electrode.

The material of the photoconductive recording layer 2 will be satisfied if it exhibits conductivity when irradiated with recording light. A suitable material for the photoconductive recording layer 2 is, for example, a photoconductive substance that has, as its main component, at least one of plumbic oxide (II) and plumbic iodide (II) (such as α-Se, PbO, and $PbI_2$, etc.), $Bi_{12}(Ge,Si)O_{20}$, or $Bi_2I_3$/organic polymer non-composite. Among them, α-Se is used as having both a relatively high quantum efficiency with respect to radiation and high dark resistance.

It is preferable that the thickness of the photoconductive recording layer 2 with α-Se as its main component be between 50 and 1000 μm in order to absorb recording light sufficiently.

The material of the charge transfer layer 3 will be more desirable if there is a greater difference (e.g., $10^2$ or more, preferably $10^3$ or more) between the mobility of the negative charge in the recording-light transmitting electrode layer 1 and the mobility of the positive charge of the opposite polarity. A desirable material for the charge transfer layer 3 is an organic compound (such as poly(N-vinycarbazole) (PVK), N,N'-diphenyl-N,N'-bis(3-methylphenyl)-[1,1'-biphenyl]-4, 1'-diamine (TPD) discotic liquid crystal, etc.); a polymer (polycarbonate, polystyrene, PUK) dispersed substance of TPD; or a semiconductor substance (such as α-Se doped 10 to 200 ppm with Cl). Particularly, the organic compound (PVK, TPD, discotic liquid crystal, etc.) is preferred because it is insensitive to light. In addition, since the dielectric constant is typically small, the capacitances of the charge transfer layer 3 and the photoconductive reading layer 4 become small and therefore the signal reading efficiency during reading can be increased. The expression "it is insensitive to light" is intended to mean that it hardly exhibits conductivity even when irradiated with recording light or reading light.

In addition, if a charge transfer layer in which the mobility of electric charge in the vertical direction is greater than that of electric charge in the horizontal direction is used, in the charge transfer layer the aforementioned transfer polarity charge moves at high speed in the direction of thickness, but is less liable to move in the lateral direction. As a result, sharpness can be enhanced. Preferred materials for the charge transfer layer are discotic liquid crystal, hexapentyloxytriphenylene (see Physical Review Letters 70.4, 1933), a discotic liquid crystal group in which the center core contains a π conjugate condensation ring or transition metal (see EKISHO VOL, No. 1, p. 55, 1997), etc.

Furthermore, if the charge transfer layer 3 includes at least (1) a first charge transfer layer consisting of a material which operates as practically an insulator with respect to an electric charge of the same polarity as the latent-image polarity charge (which is the electric charge in the photoconductive recording layer 2) and (2) a second charge transfer layer consisting of a material which operates as practically a conductor with respect to the transfer polarity charge (which is an electric charge having a polarity opposite to the latent-image polarity charge), and if the charge transfer layer 3 is constructed so that the first charge transfer layer is stacked on the side of the photoconductive recording layer 2 and the second charge transfer layer is stacked on the side of the photoconductive reading layer 4, then the second transfer layer can transfer the transfer polarity charge at high speed and the first charge transfer layer can have strong insulation resistance with respect to the latent-image polarity charge. Note that the thus-constructed charge transfer layer 3 is called a stacked hole transfer layer. As a result, the stacked hole transfer layer 3 becomes an ideal charge transfer layer that is excellent in afterimage and read response speed. More specifically, the first and second charge transfer layers can be constructed by a layer of at least either PVK or TPD having a thickness of 0.1 to 1 μm and a layer of α-Se doped 10 to 200 ppm with Cl having a thickness of 5 to 30 μm, respectively, so that the second charge transfer layer becomes thicker than the first charge transfer layer.

If the PVK layer is compared with the TPD layer, the PVK layer is stronger in the property of operating as practically an insulator with respect to an electric charge of the same polarity as the latent-image polarity charge (in the first embodiment, a negative charge) than the TPD layer. Also, the TPD layer is stronger in the property of operating as practically a conductor with respect to the transfer polarity charge (in the first embodiment, a positive charge) than the PVK layer. Therefore, a charge transfer layer, including the TPD and PVK layers, may be stacked so that the TPD layer is on the side of the photoconductive reading layer 4 and the PVK layer is on the side of the photoconductive recording layer 2.

The charge transfer layer 3 is not limited to two layers, but may be constructed with a plurality of layers. In this case, the layers are compared with respect to the aforementioned properties, and the layers, which are relatively stronger in the property of operating as practically an insulator with respect to an electric charge of the same polarity as the latent-image polarity charge, are stacked on the side of the photoconductive recording layer 2. The layers, which are relatively stronger in the property of operating as practically a conductor with respect to the transfer polarity charge, are stacked on the side of the photoconductive reading layer 4.

The material of the photoconductive reading layer 4 will be satisfied if it exhibits conductivity when irradiated with reading light. A preferred material for the photoconductive reading layer 4 is, for example, a photoconductive substance that has, as its main component, at least one of α-Se, Se—Te, Se—As—Te, non-metal phthalocyanine, metal phthalocyanine, magnesium phthalocyanine (MgPc), phase II of vanadyl phthalocyanine (VoPC), or copper phthalocyanine (CuPc).

If the photoconductive reading layer 4 uses a photoconductive substance that has high sensitivity to electromagnetic wave having wavelength (300 to 550 nm) in near ultraviolet to blue regions and low sensitivity to electromagnetic waves having wavelength (700 nm or more) in a red region, more specifically a photoconductive substance having at least one of α-Se, $PbI_2$, $Bi_{12}(Ge,Si)O_{20}$, perilenebisimide (R=n-propyl), or perilenebisimide (R=n-neopentyl) as its main component, then in the photoconductive reading layer 4 the bandgap is great and the occurrence of dark current due to heat is slight. Therefore, if electromagnetic waves having wavelength (300 to 550 nm) in near ultraviolet to blue regions are scanned during reading, noise due to dark current can be reduced.

It is desirable that the total thickness of the charge transfer layer 3 and the photoconductive reading layer 4 be one-half or less of the thickness of the photoconductive recording layer 2. If the total thickness become thinner (e.g., 1/10 or less, preferably 1/20 or less), responsivity during reading will enhance.

Particularly, α-Se with a thickness of 0.05 to 0.5 μm is preferred because the dark resistance becomes extremely high. Therefore, the photoconductive reading layer 4 in the first embodiment consists of a layer of thickness 0.05 to 0.5 μm which has α-Se as its main component.

The second hole transfer layer of thickness 5 to 30 μm in the charge transfer layer 3, which consists of α-Se doped 10 to 200 ppm with Cl, can be replaced with α-Se of thickness 5 to 30 μm so that it can also serve as the photoconductive reading layer 4. In this case, the fabrication of the electrostatic recording body 10 becomes relatively simpler.

Now, a brief description will be given of a fundamental method of recording image information on the aforementioned electrostatic recording body 10 as an electrostatic latent image and then reading out the recorded electrostatic latent image. FIG. 3 integrally illustrates an electrostatic latent image recorder and an electrostatic latent image reader, which each employ the electrostatic recording body 10, for the convenience of explanation. The electrostatic latent image recorder and the electrostatic latent image reader constitute a recording-reading system. Note that in FIG. 3, the support body 8 has been omitted.

The recording-reading system includes the electrostatic recording body 10, recording-light emission means 90, a current detection circuit 80, and reading-light scan means 92. The current detection circuit 80 has first connection means S1, a power source 70, second connection means S2, and a detection amplifier 81. The electrostatic latent image recorder section of the recording-reading system has the electrostatic recording body 10, the power source 70, and the recording-light emission means 90, and the first connection means S1, while the electrostatic latent image reader section has the electrostatic recording body 10, the current detection circuit 80, and the second connection means S2.

The detection amplifier 81 consists of an operational amplifier 81a and a feedback resistor 81b and serves as a so-called current-voltage converting circuit. The detection amplifier 81 is not limited to this construction, but may be constructed as a charge amplifier.

The recording-light transmitting electrode layer 1 of the electrostatic recording body 10 is connected to the negative electrode of the power source 70 through the first connection means S1 and is also connected to the output end of the second connection means S2. One of the input ends of the second connection means S2 is connected to the inverting input terminal (−) of the operational amplifier 81a. The reading-light transmitting electrode layer 5 of the electrostatic recording body 10, the positive electrode of the power source 70, the other input end of the second connection means S2, and the non-inverting input terminal (+) of the operational amplifier 81a, are connected to ground.

A subject 9 is disposed over the recording-light transmitting electrode layer 1. The subject 9 has a radiation transmitting portion 9a which allows radiation L1 to pass through it, and a radiation intercepting portion 9b which prevents radiation L1 from passing through it. The recording-light emission means 90 is used for uniformly emitting radiation L1 (e.g., X-rays) to the subject 9. The reading-light scan means 92 is used to scan reading light L2 (e.g., laser light) on the reading-light transmitting electrode layer 5 of the electrostatic recording body 10 in the direction of an arrow in FIG. 3. The reading light L2 is in the form of a light beam.

In recording an electrostatic latent image on the electrostatic recording body 10, the second connection means S2 is caused to be in an OFF state, and the first connection means S1 is caused to be in an ON state so that dc voltage Ed is applied between the recording-light transmitting electrode layer 1 and the reading-light transmitting electrode layer 5 by the power source 70. As a result, the recording-light transmitting electrode layer 1 has a negative charge, and the reading-light transmitting electrode layer 5 has a positive charge. The electrostatic recording body 10 then has a parallel electric field between the recording-light transmitting electrode layer 1 and the reading-light transmitting electrode layer 5.

Next, the radiation L1 is uniformly emitted from the recording-light emission means 90 to the subject 9. The radiation L1 is transmitted through the radiation transmitting portion 9a of the subject 9 and is further transmitted through the recording-light transmitting electrode layer 1. The photoconductive recording layer 2 receives the transmitted radiation L1 (the radiation transmitted through the subject 9 becomes recording light), and has a pair of electric charges (i.e., a negative charge (the latent-image polarity charge in the first embodiment) and a positive charge (the transfer polarity charge in the first embodiment)) corresponding to the light quantity of the radiation L, thereby exhibiting conductivity.

The positive charge in the photoconductive recording layer 2 moves toward the recording-light transmitting electrode layer 1 at high speed and disappears by recombining with the negative charge in the recording-light transmitting electrode layer 1 at the interface between the recording-light transmitting electrode layer 1 and the photoconductive recording layer 2 (charge recombination). On the other hand, the negative charge in the photoconductive recording layer 2 moves toward the charge transfer layer 3. The charge transfer layer 3 operates as an insulator with respect to the latent-image polarity charge of the same polarity as the electric charge of the recording-light transmitting electrode layer 1 (in the first embodiment, a negative charge), so the negative charge being moved toward the charge transfer layer 3 stops at the charge storage portion 23 formed in the interface between the photoconductive recording layer 2 and the charge transfer layer 3 and is stored in this interface (charge storage portion 23). The quantity of the negative charge to be stored is determined by the quantity of the negative charge in the photoconductive recording layer 2, that is, the quantity of the radiation L1 transmitted through the subject 9. On the other hand, since the radiation L1 does not pass through the radiation intercepting portion 9b of the subject 9, the portion under the radiation intercepting portion 9b of the subject 9 does not have any change.

In this manner, the electric charge corresponding to the subject image can be stored in the charge storage portion 23 formed in the interface between the photoconductive recording layer 2 and the charge transfer layer 3, by emitting the radiation L1 to the subject 9. Note that the subject image carried by the stored latent-image polarity charge is referred to as an electrostatic latent image. As will be clear in the above-mentioned explanation, the construction of the recorder of the present invention for recording an electrostatic latent image on the electrostatic recording body 10 is extremely simple, so the recording operation also becomes extremely simple.

In reading out the thus-recorded electrostatic latent image, the first connection means S1 is opened so that a power supply is interrupted. The second connection means S2 is connected to ground so that the electrode layers 1 and 5 of the electrostatic recording body 10 have the same electric potential. With this, relocation of the electric charges is performed. Thereafter, the second connection means S2 is connected to the side of the detection amplifier 81.

Next, the reading-light transmitting electrode layer 5 of the electrostatic recording body 10 is scanned with the reading light L2 emitted from the reading-light scan means 92. The reading light L2 passes through the reading-light transmitting electrode layer 5. The photoconductive reading layer 4 irradiated with the reading light L2 exhibits conductivity. This depends on a pair of positive and negative charges generated by irradiation of the reading light L2, in the same way as the photoconductive recording layer 2 exhibits conductivity by having a pair of positive and negative charges when irradiated with the radiation L1.

Between the charge storage portion 23 (between the photoconductive recording layer 2 and the charge transfer layer 3), having stored the latent-image polarity charge, and the reading-light transmitting electrode layer 5, a very strong electric field is formed in accordance with the total thickness of the photoconductive reading layer 4 and charge transfer layer 3 and the quantity of the latent-image polarity charge. Since the charge transfer layer 3 operates as a conductor with respect to the transfer polarity charge (in the first embodiment, a positive charge), the positive charge in the photoconductive reading layer 4 is attracted by the latent-image polarity charge of the charge storage portion 23 and moves quickly through the charge transfer layer 3, and disappears by recombining with the latent-image polarity charge at the charge storage portion 23. On the other hand, the negative charge in the photoconductive reading layer 4 disappears by recombining with the positive charge of the reading-light transmitting electrode layer 5. The photoconductive layer 4 is scanned with the reading light L2 having a sufficient quantity of light, and the electrostatic latent image, carried by the latent-image polarity charge stored in the charge storage portion 23, is caused to disappear completely by charge recombination. Thus, the disappearance of the electric charge stored in the electrostatic recording body 10 indicates that current flows through the electrostatic recording body 10 by movement of an electric charge. Since the electrostatic recording body 10 is connected with the current detection circuit 80, the generated current is converted into a voltage signal by the detection amplifier 81. Based on the voltage signal, an image signal is obtained.

If the total thickness of the photoconductive reading layer 4 and the charge transfer layer 3 becomes thin compared with the thickness of the photoconductive recording layer 2, electric charge will move more quickly and therefore reading can be performed at higher speed. Besides, if the mobility of the negative charge in the charge transfer layer 3 is sufficiently smaller than that of the positive charge (e.g., $1/10^3$ or less), storage of a stored electric charge will be enhanced and retention of an electrostatic latent image will be enhanced.

Figure 4A:
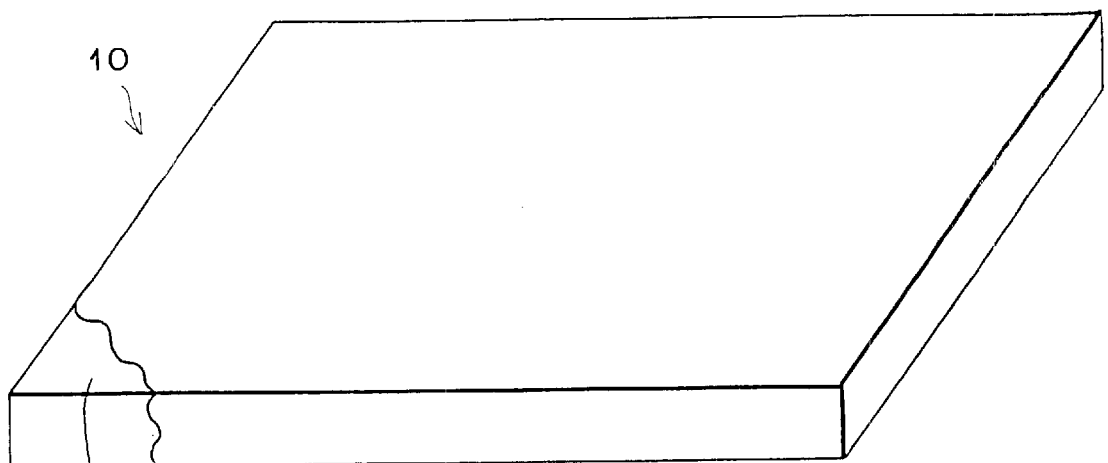
FIG. 4A is a perspective view showing an electrostatic recording body constructed according to a second embodiment of the present invention.
Figure 4B:
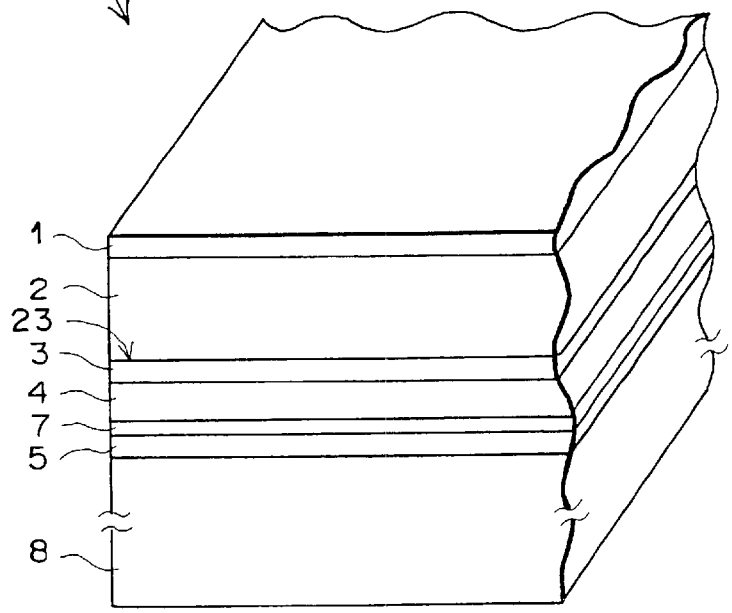
FIG. 4B is an enlarged part-sectional view of the electrostatic recording body shown in FIG. 4A.

FIG. 4 illustrates an electrostatic recording body 10 constructed according to a second embodiment of the present invention. The electrostatic recording body 10 of the second embodiment differs from that of the first embodiment in that a blocking layer 7, which allows reading light to pass through it and also blocks the electric charge that is injected via the electrode of the reading-light transmitting electrode layer 5, is provided between the photoconductive reading layer 4 and the reading-light transmitting electrode layer 5. Note that recording and reading can be similarly performed by use of the same system as that in the first embodiment.

In the case where the blocking layer 7 is not provided as in the first embodiment, part of the electric charge in the reading-light transmitting electrode layer 5 (in this embodiment, a positive charge) is injected directly into the photoconductive reading layer 4. The positive charge injected directly into the photoconductive reading layer 4 moves within the charge transfer layer 3 and recombines with the stored electric charge (i.e., the latent-image polarity charge). As a result, the stored electric charge disappears. The disappearance of the stored electric charge by this charge recombination results in a noise component, because it is not disappearance caused by irradiation of the reading light. On the other hand, if the blocking layer 7, consisting of an organic thin film, is interposed between the photoconductive reading layer 4 and the reading-light transmitting electrode layer 5, as in the second embodiment, the positive charge in the reading-light transmitting electrode layer 5 will no longer be injected into the photoconductive reading layer 4 because of the barrier potential and therefore the occurrence of noise due to the direct injection of the positive charge can be prevented.

As is well known, when a selenium film in an amorphous state is formed, interfacial crystallization growth occurs at the interface between the film and the adjacent metal in the deposition step. In the electrostatic recording body 10 of the present invention, the photoconductive reading layer 4 is formed after formation of the reading-light transmitting electrode layer 5. Therefore, in the step of depositing the photoconductive reading layer 4 and also in the step of depositing the charge transfer layer 3 and the photoconductive recording layer 2, interfacial crystallization growth occurs at the interface between the electrode material and α-Se. Because of an increase in the injection of electric charge through the electrode of the reading-light transmitting electrode layer 5, the problem of a reduction in the S/N ratio will arise. In the case where a transparent oxide film, particularly an ITO film, is employed as an electrode material, interfacial crystallization growth increases appreciably at the interface between the electrode material and α-Se, and S/N-ratio reduction becomes conspicuous. However, in the second embodiment, the blocking layer 7 consisting of an organic thin film is interposed between the reading-light transmitting electrode layer 5 and the photoconductive reading layer 4, so the blocking layer 7 can function as a suppression layer which suppresses the interfacial crystallization of α-Se. Thus, the direct contact between the electrode material of the reading-light transmitting electrode layer 5 and the α-Se of the photoconductive reading layer 4 can be prevented. This prevents selenium (Se) from changing chemically at the interface and obtains the effect of preventing interfacial crystallization. Consequently, there is no increase in the injection of electric charge through the electrode of the reading-light transmitting electrode layer 5, and the problem of S/N-ratio reduction can be solved.

In addition, in the second embodiment, elastic material is employed as the blocking layer 7. The blocking layer 7 functions as a buffer layer which alleviates thermal stress between the support body 8 and the photoconductive reading layer 4. Preferably, the blocking layer 7 also functions as a layer which reinforces the connection between the photoconductive reading layer 4 and the reading-light transmitting electrode layer 5.

If the blocking layer 7 has the function of buffering thermal stress, the thermal stress due to a difference in thermal expansion between the photoconductive reading layer 4 and the reading-light transmitting electrode layer 5 can be alleviated by the mechanical-stress buffering operation of the blocking layer 7. Therefore, the material of the support body 8 can be selected without considering the thermal expansion coefficient of the photoconductive reading layer 4. For instance, even in the case of employing a glass substrate, there occurs the effect of alleviating a thermal expansion mismatch between the glass substrate as the support body 8 and the selenium (Se) film as the photoconductive reading layer 4. Therefore, there is no possibility that as with the first embodiment, the problem of destruction due to a difference in thermal expansion will arise, even under a severe environment.

It is preferable that the blocking layer 7 be constructed, for example, of an elastic organic thin film so that it can also function as the buffer layer that alleviates thermal stress. The blocking layer 7 can employ, for example, an organic polymer insulation film, which is transparent to reading light (e.g., blue light) and has satisfactory hole blocking performance, such as polyamide, polyimide, polyester, polyvinylbutyral, polyvinylpyrolidone, polyurethane, polymethylmethacrylate, and polycarbonate, disclosed in the aforementioned U.S. Pat. No. 4,535,468. The blocking layer 7 can also employ a mixed film, consisting of an organic binder and a low molecular organic material (e.g., nigrosine of about 0.3 to 3% wt).

It is preferable that the thickness of the organic thin film be about 0.05 to 5 μm. However, a range of 0.1 to 5 μm is preferred in order to buffer thermal stress. On the other hand, a range of 0.05 to 0.5 μm is preferred in order to obtain satisfactory blocking performance having no afterimage. From a trade-off between the two, it is desirable that the film thickness be in a range of 0.1 to 0.5 μm.

FIG. 5 illustrates an electrostatic recording body 10 constructed according to a third embodiment of the present invention. The electrostatic recording body 10 of the third embodiment differs from that of the second embodiment in that the electrode of the reading-light transmitting electrode layer 5 is replaced with a stripe electrode 6. The stripe electrode 6 has a plurality of electrode elements (line electrode elements) 6a disposed at intervals of a pixel pitch. In this case, the upper blocking layer 7 is stacked directly on the stripe electrode 6 without interposing an insulator between adjacent electrode elements 6a. Thus, the reading-light transmitting electrode layer 5 is constructed with only the stripe electrode 6.

Some of the purposes of replacing the electrode of the reading-light transmitting electrode layer 5 with the stripe electrode 6, as described later, are: to make the correction of structure noise easier; to enhance the S/N ratio of an image by reducing capacitance; to make the intensity of an electric field stronger to enhance reading efficiency and enhance the S/N ratio by localizing an electrostatic latent image in accordance with the location of the stripe electrode (line electrode elements); and to shorten reading time by performing parallel reading (mainly in the horizontal direction).

Figure 6A:
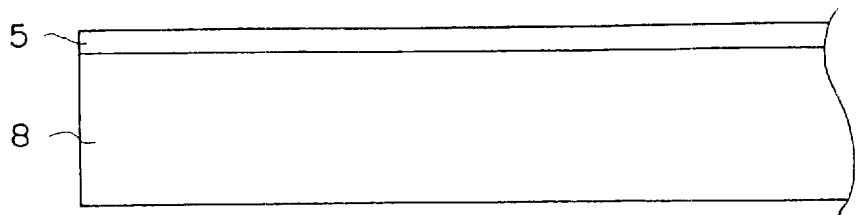
FIGS. 6A through 6C are diagrams showing how the electrostatic recording body of the third embodiment is fabricated by a dipping method.
Figure 6B:
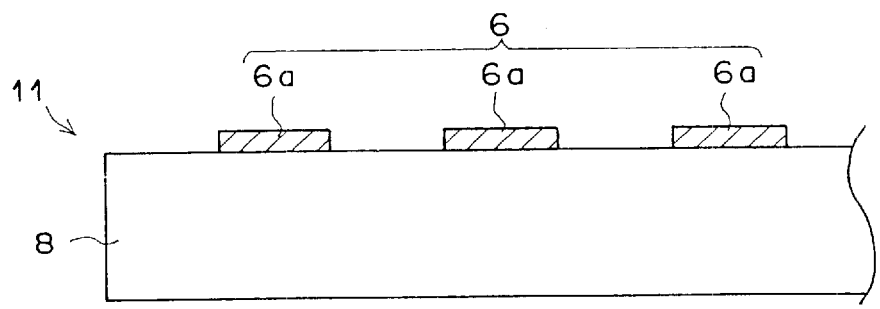

In fabricating the electrostatic recording body 10 of the third embodiment, either an ITO film or a transparent oxide film (such as an IDIXO film easy to etch, etc.) is first formed to a predetermined thickness (e.g., about 200 nm) on the support body 8 in order to form the reading-light transmitting electrode layer 5 (see FIG. 6A). After formation of the ITO film, the stripe electrode 6 (which consists of electrode elements 6a) is formed by photoetching (see 6B). According to this method, a fine stripe pattern with a pixel pitch of about 50 to 200 $\mu$m, which is suitable for medical applications, can be inexpensively formed.

Note that the IDIXO film is a film that is easy to etch. If the IDIXO film is employed as the electrode material which forms the electrode element 6a, there is no fear of dissolving the support body 8 when etching the IDIXO film and therefore the material of the support body 8 can be widely selected.

Next, a material for the blocking layer 7, which also functions as a buffer layer, is formed to a predetermined thickness (e.g., about 200 nm) so that the coating direction is along the electrode element 6a. That is, the material for the blocking layer 7 is coated to the predetermined thickness in the longitudinal direction of the electrode element 6a. When the reading-light transmitting electrode layer 5 is flat in shape, as in the second embodiment, it can be coated regardless of the coating direction, for example, by spin coating. However, the spin coating is not suitable for the third embodiment.

When coating and forming the blocking layer 7, which also functions as a layer which buffers thermal stress, in the longitudinal direction of the electrode element 6a, it is preferable to form the stripe electrode 6 on the support body 8 and then employ a coating method, which performs coating by one-dimensionally moving a member, a nozzle, or a brush, such as a dipping method, a spraying method, a bar coating method, and a screen coating method.

Figure 6C:
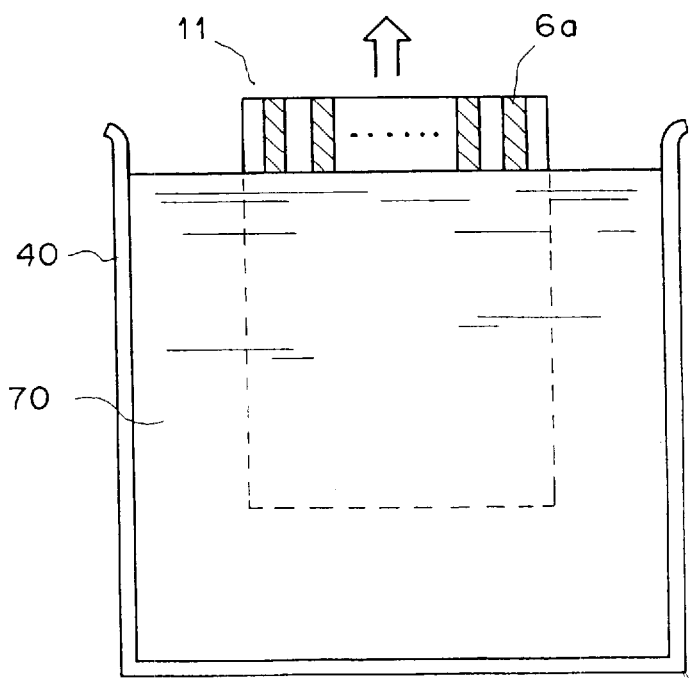

FIG. 6C illustrates a dipping method. In the dipping method, a container 40 is first filled with a material solution 70 for the blocking layer 7, and then a member 11 with the stripe electrode 6 formed on the support body 8 is immersed along the longitudinal direction of the electrode element 6a into the solution 70 and is lifted out of the container 40. Even in the case where the member 11, that is, the size of the electrostatic recording body 10, is large, the dipping method can be performed by only employing a container that corresponds to the size. In addition, the film thickness can be adjusted by repeating the immersing and lifting operations. Thus, the dipping method has the advantage that a large size of electrostatic recording body with a desired film thickness can be easily fabricated.

Figure 7A:
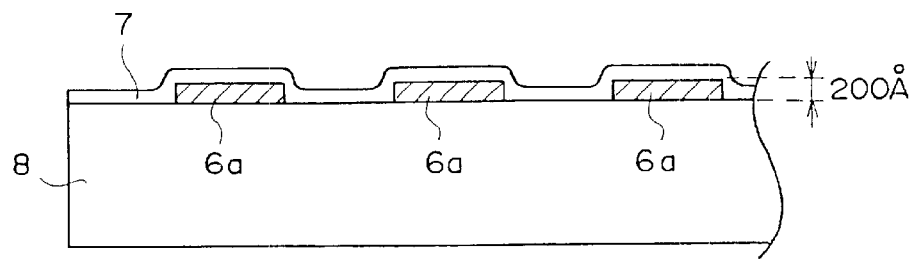
FIGS. 7A and 7B are sectional views showing how a blocking layer is formed according to the third embodiment by one method.

FIG. 7A shows the state in which the blocking layer 7 has been coated on the electrode elements 6a in the longitudinal direction of the electrode element 6a. As illustrated in the figure, the blocking layer 7 is not discontinuous at the edges of the electrode elements 6a. That is, the blocking layer 7 is coated continuously over the upper surface (on the side of the photoconductive reading layer 4) and side surfaces of the electrode elements 6a and the upper surface (on the side of the photoconductive reading layer 4) of the support body 8 so that all the surfaces, on the side of the photoconductive reading layer 4, of the electrode elements 6a are completely covered.

Figure 7B:
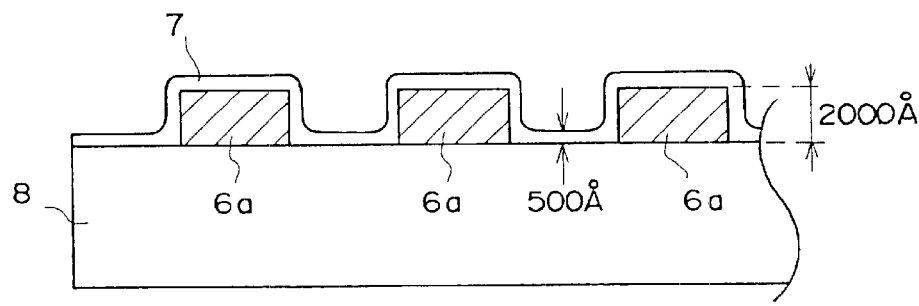

Even in the case of making the transparent oxide film of the electrode element 6a relatively thicker (e.g., about 2000 Å) in order to reduce the longitudinal resistance (line resistance) of the electrode element 6a, a continuous film of about 50 to 500 nm (0.05 to 0.5 $\mu$m), for example, can be satisfactorily formed even when the edge difference between the electrode element 6a and the support body 8 is great as shown in FIG. 7B; by coating an organic polymer in the longitudinal direction of the electrode element 6a. Thus, a satisfactory blocking characteristic is obtained. In addition, a film with a thickness of about 5 $\mu$m can be continuously formed by repeating the coating operation.

As with the second embodiment, the blocking layer 7 functions as a buffer layer and is therefore able to alleviate thermal stress due to the difference in thermal expansion between the photoconductive reading layer 4 and the support body 8. Thus, as with the first and second embodiments, there is no possibility that the problem of destruction due to the thermal expansion difference will arise.

Figure 7C:
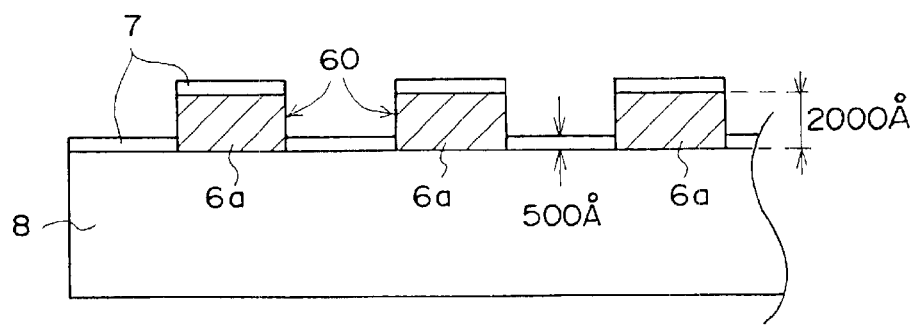
FIG. 7C is a sectional view showing how a blocking layer is formed according to the third embodiment by another method.

On the other hand, in the case of forming an ITO thin film of thickness about 2000 Å and then stacking a $CeO_2$ film on the ITO film by resistance-heating vacuum deposition, the entire electrode element 6a cannot be covered with the $CeO_2$ blocking film, because the edge difference between the electrode element 6a and the support 8 is great as shown in FIG. 7C. Therefore, the $CeO_2$ blocking layer cannot be formed as shown in FIG. 7B. Because of this, the injection of dark current into the electrode element 6a through a portion 60 having no blocking film cannot be prevented. The degradation of the blocking performance will give rise to the problem of S/N-ratio reduction. If the electrode element 6a (i.e., the reading-light transmitting electrode layer 5) becomes thicker, the edge difference between the electrode element 6a and the support body 8 becomes greater and it becomes difficult to form a blocking layer which covers the entire surface continuously. In such a case, the degradation of the blocking performance becomes conspicuous.

Now, a brief description will be given of a fundamental method of recording image information on the electrostatic recording body 10 of the third embodiment as an electrostatic latent image and then reading out the recorded electrostatic latent image. FIG. 8 illustrates a recording-reading system employing the electrostatic recording body 10 of the third embodiment. Note that in FIG. 8, the support body 8 has been omitted.

The recording-reading system of the third embodiment differs from that of the first embodiment in that the electrode elements 6a are connected individually to detection amplifiers 81 and that an image signal is acquired by scanning the electrostatic recording body 10 in the longitudinal direction of the electrode element 6a (i.e., in a vertical scanning direction) with reading light extending in a horizontal scanning direction perpendicular to the vertical scanning direction (i.e., with line light).

Reading-light scan means 93 is used for scanning the line-shaped reading light L2, perpendicular to the electrode elements 6a of the reading-light transmitting electrode layer 5, in the longitudinal direction of the electrode element 6a indicated by an arrow in FIG. 8. If the electrostatic recording body 10 with the stripe electrode 6 is employed, there is no need to scan the electrostatic recording body 10 with a laser light beam, so the construction of the optical scanning system can be made simpler and less expensive. In addition, since incoherent light can be used, the occurrence of noise due to interference fringes can be prevented.

A current detection circuit 80 is provided with the detection amplifiers 80 connected respectively to the electrode elements 6a of the reading-light transmitting electrode layer 5. The recording-light transmitting electrode layer 1 of the electrostatic recording body 10 is connected to one of the two inputs of connection means S3 and the negative electrode of a power source 70. The positive electrode of the power source 70 is connected to the other input of the connection means S3. The output of the connection means S3 is connected in common to the non-inverting input terminals (+) of the operational amplifiers 81a of the detection amplifiers 81. The electrode elements 6a are connected to the inverting input terminals (−) of the operational amplifiers 81a, respectively. The detection amplifier 81 constitutes a charge amplifier, constructed of the operational amplifier 81a, an integrating capacitor 81c, and a switch 81d.

A description will be made of the process of recording an electrostatic latent image on the electrostatic recording body 10 of the third embodiment, with reference to FIGS. 9A through 9C. Note that in the figures, the support body 8 has been omitted.

The recording process is basically the same as that in the first embodiment, but differs slightly in the manner of storing electric charge on the charge storage portion 23. Initially, dc voltage is applied between the recording-light transmitting electrode layer 1 and each electrode element 6a of the reading-light transmitting electrode layer 5 so that the electrode layer 1 has a positive charge and the electrode layer 5 has a negative charge. With application of the dc voltage, a U-shaped electric field is formed between the recording-light transmitting electrode layer 1 and the electrode element 6a of the reading-light transmitting electrode layer 5, and a nearly parallel electric field is present in the greater part of the photoconductive recording layer 2. However, at the interface between the conductive layer 2 and the charge transfer layer 3, there are portions where no electric field is present (see portions indicated by Z in FIG. 9A). If the total thickness of the charge transfer layer 3 and photoconductive reading layer 4 is thin compared with the thickness of the photoconductive recording layer 2, also if the ratio between the width and pitch of the electrode element 6a is small (preferably, 75% or less), and furthermore, if the total thickness of the charge transfer layer 3 and photoconductive reading layer 4 is nearly equal to or less than the pitch between adjacent electrode elements 6a, such portions having no electric field will be distinctly formed.

If, in the state shown in FIG. 9A, radiation L1 is emitted to the subject 9, the negative charge of the positive and negative charges, generated by the radiation L1 transmitted through the radiation transmitting portion 9a of the subject 9, is concentrated to the electrode element 6a along the electric field distribution (see FIG. 9B) and therefore the electrostatic latent image is recorded with the electrode element 6a as its center (see FIG. 9C). Particularly, in the case where the quantity of the radiation L1 is small, the negative charge is attracted to the center of the electrode element 6a and is separated by the electrode elements 6a. In addition, the negative charge is stored according to the positions of the electrode elements 6a. Therefore, if the pitch between the electrode elements 6a (or the pitch between pixels) is narrowed, the electrostatic latent image can be recorded with high sharpness (high spatial resolution). Furthermore, the concentration of the electric field to each electrode element 6a can enhance the reading efficiency and increase the S/N ratio. The recent advances in the semiconductor fabrication technology have made it possible to form the electrode elements 6a at sufficiently narrow intervals, so the electrostatic recording body 10 of the third embodiment can be readily fabricated. As with the first embodiment, the positive charge of the charge pair generated within the photoconductive recording layer 2 is attracted to the recording-light transmitting electrode layer 1 and disappears.

In reading out the thus-recorded electrostatic latent image, the connection means S3 is connected to the side of the recording-light transmitting electrode layer 1 of the electrostatic recording body 10 so that the electrode layers 1 and 5 of the electrostatic recording body 10 have the same electric potential through the imaginary short of the operational amplifiers 81a. With this, relocation of the electric charges is performed. Next, the reading light L2 in the form of a line is scanned in the longitudinal direction of the electrode element 6a by the reading-light scan means 93. As with the first embodiment, the photoconductive reading layer 4 irradiated with the reading light L2 exhibits conductivity, and current flows within the electrostatic recording body 10. With the generated current, the integrating capacitor 81c of the detection amplifier 81 connected to each electrode element 6a is charged with electricity. Also, electric charge is stored in the integrating capacitor 81c in accordance with the quantity of the generated current, and furthermore, the voltage between both ends of the integrating capacitor 81c rises. For each detection amplifier 81, the switch 81d is switched on so that the integrating capacitor 81c is discharged between pixels being scanned with the reading light L2. As a result, a change in the voltage appears sequentially between both ends of the integrating capacitor 81c in accordance with the electric charge stored for each pixel. Since the voltage change corresponds to the electric charge stored for each pixel on the electrostatic recording body 10, the electrostatic latent image can be read out by detecting the voltage change.

Thus, if the electrostatic latent image is read out from the electrostatic recording body 10 by scanning the recording body 10 in the longitudinal direction of the electrode element 6a with the reading light L2 in the form of a line, parallel image signals can be obtained in the horizontal scanning direction with the individual detection amplifiers 81 and therefore the reading time can be shortened. In addition, since the reading-light transmitting electrode layer 5 is constructed of electrode elements 6a, the capacitance, distributed by the charge transfer layer 3 and the photoconductive reading layer 4, becomes small and therefore the detection amplifier 81 becomes less likely to be affected by noise. Also, since pixels can be fixed in the intervals of at least an electrode element pitch (pixel pitch) image data can be corrected according to the location of each electrode element 6a so that a correction of structure noise is carried out accurately.

In addition, the electrode element 6a of the reading-light transmitting electrode layer 5 and the latent-image polarity charge attract each other, so that the transfer polarity charge, generated according to the electric field by irradiation of the reading light L2, tends to cancel the latent-image polarity charge. Therefore, it becomes possible to maintain sharpness high even during reading. Particularly, when the quantity of a stored charge is small, the effect is great. If the reading light L2 is intercepted between the electrode elements 6a, sharpness can be further enhanced.

Since the intensity of the electric field across the photoconductive reading layer 4 becomes stronger near the electrode element 6a, a pair of electric charges are generated according to the stronger electric field by the reading light L2. Therefore, an ion dissociation efficiency for an exciton rises and an quantum efficiency for the occurrence of a charge pair can approach 1. The reading efficiency is enhanced, so that the S/N ratio can be increased and the light energy density can be reduced. Furthermore, the capacitances of the charge transfer layer 3 and the photoconductive reading layer 4 can be reduced, so that the signal reading efficiency during reading can be increased.

As described above, in the stacked construction of the image recording medium disclosed in the aforementioned U.S. Pat. No. 4,535,468, it is difficult to form a stripe electrode in the final fabrication step and it is therefore difficult to obtain the effects of the present invention described above. Thus, the significance of forming the electrostatic recording body of the present invention in which the reading-light transmitting electrode layer is formed on the support body is extremely great.

If the material between the electrode elements 6 intercepts the reading light L2, and if a light intercepting portion and a light transmitting portion are also provided at predetermined intervals in the longitudinal direction of the electrode element 6a (i.e., the scanning direction), portions corresponding to the openings in a so-called drain-board are formed as reading-light transmitting portions, so that a reduction in the spatial resolution due to a leakage of light between adjacent reading-light transmitting portions can be avoided in the longitudinal direction of the electrode element 6a during reading. Scanning is practically performed in parallel with small spot beams, so that a read image with extremely high sharpness can be obtained even if the reading light is not so converged.

While the present invention has been described with reference to the preferred embodiments of the image recording medium, the invention is not to be limited to the embodiments mentioned above.

For example, in the aforementioned embodiments, the recording-light transmitting electrode layer has a negative charge and the reading-light transmitting electrode layer has a positive charge, and a negative charge is stored in the charge storage portion formed at the interface between the photoconductive recording layer and the charge transfer layer. However, the present invention is not always limited to these embodiments. The polarities may be reversed. In the case of reversing the polarities, only a slight change is required. For instance, the charge transfer layer which functions as a hole transfer layer is changed to a charge transfer layer which functions as an electron transfer layer. The photoconductive reading layer can likewise employ the aforementioned photoconductive substance such as α-Se, plumbic oxide (II), plumbic iodide (II), etc. Suitable materials for the charge transfer layer are trinitrofluorenylidenaniline (TNFA), a trinitrofluorenone (TNF)/polyester dispersion system, and an asymmetrical diphenoxenon dielectric. The photoconductive reading layer can similarly employ non-metal phthalocyanine and metal phthalocyanine.

In either modification, in the case where the buffer layer is not provided between the photoconductive reading layer and the reading-light transmitting electrode layer, the substances of the support body and the photoconductive reading layer, in addition to the support body being transparent to the reading light, are selected so that the difference in thermal expansion coefficient between the support body and the photoconductive reading layer becomes small so that no structural destruction occurs due to thermal stress generated by a temperature change in environment between the support body and the photoconductive reading layer. In many cases, the material of the photoconductive reading layer is first selected so that characteristics are obtained according to applications. Therefore, in selecting the material of the support body, the material is selected so that the thermal expansion coefficient is within a few tenths to a few times the thermal expansion coefficient of the substance of the photoconductive reading layer. It is preferable that the thermal expansion coefficient of the support body be relatively near to that of the photoconductive reading layer and further preferable that the thermal expansion coefficient of the support body be nearly equal to that of the photoconductive reading layer.

Although, in the aforementioned embodiments, the charge storage portion is formed between the photoconductive recording layer and the charge transfer layer, the present invention is not limited to these embodiments. For instance, as described in the aforementioned U.S. Pat. No. 4,535,468, the charge storage portion may be formed by a trap layer that stores the latent-image polarity charge as a trap.

The above-mentioned embodiments have been based on the image recording medium in which (1) the first electrode layer (reading-light transmitting electrode layer) which allows the reading light to pass through it, (2) the photoconductive reading layer which exhibits conductivity when irradiated with the reading light, (3) the charge storage portion for storing the latent-image polarity charge, (4) the photoconductive recording light which generates the latent-image polarity charge when irradiated with the recording light, and (5) the second electrode layer (recording-light transmitting electrode layer) which allows the recording light to pass through it, are stacked in the recited order on the support body which allows the reading light to pass through it. However, the image recording medium of the present invention does not always need to be provided with all the layers. For instance, the image recording medium will be satisfied if at least one photoconductive layer is formed on the support body.

What is claimed is:

1. An image recording medium comprising:
  a support body which transmits reading electromagnetic waves;
  a first electrode layer, formed on said support body, which allows said reading electromagnetic waves to pass through it;
  a photoconductive reading layer, formed on said first electrode layer, which exhibits conductivity when irradiated with said reading electromagnetic waves;
  a charge storage portion, formed on said photoconductive reading layer, for storing a latent-image polarity charge;

a photoconductive recording layer, formed on said charge storage portion, for generating said latent-image polarity charge when irradiated with recording electromagnetic waves; and a second electrode layer, formed on said photoconductive recording layer, which allows said recording electromagnetic waves to pass through it;

wherein a difference in thermal expansion coefficient between said support body and said photoconductive reading layer is small so that no structural destruction occurs between said support body and said photoconductive reading layer because of thermal stress generated by a temperature change in environment.

2. An image recording medium according to claim 1, wherein said support body is deformable with said temperature change in environment.

3. An image recording medium according to claim 2, wherein said support body is composed of an organic polymer material.

4. An image recording medium according to claim 2, wherein the thermal expansion coefficient of said support body is nearly equal to that of said photoconductive reading layer.

5. An image recording medium according to claim 1, wherein said support body is composed of an organic polymer material.

6. An image recording medium according to claim 5, wherein said organic polymer material is polycarbonate.

7. An image recording medium according to claim 5, wherein said organic polymer material is polymethylmethacrylate.

8. An image recording medium according to claim 1, wherein the thermal expansion coefficient of said support body is nearly equal to that of said photoconductive reading layer.

9. An image recording medium according to claim 8, wherein said photoconductive reading layer has amorphous selenium ($\alpha$-Se) as its main component; and the thermal expansion coefficient of said support body is 1.2 to $6.2 \times 10^{\wedge}-5/K@40°$ C. ("^", represents an exponent).

10. An image recording medium according to claim 7, wherein the thermal expansion coefficient of said support body is 2.2 to $5.2 \times 10^{\wedge}-5/K@40°$ C. (where "^" represents an exponent).

* * * * *